US012501741B2

(12) United States Patent
Abe

(10) Patent No.: US 12,501,741 B2
(45) Date of Patent: Dec. 16, 2025

(54) METHOD FOR MANUFACTURING LIGHT-EMITTING ELEMENT

(71) Applicant: NICHIA CORPORATION, Anan (JP)

(72) Inventor: Hiroki Abe, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 624 days.

(21) Appl. No.: 17/900,509

(22) Filed: Aug. 31, 2022

(65) Prior Publication Data

US 2023/0070972 A1  Mar. 9, 2023

(30) Foreign Application Priority Data

Sep. 1, 2021 (JP) ................................ 2021-142418
Aug. 31, 2022 (JP) ................................ 2022-137794

(51) Int. Cl.
*H01L 21/78* (2006.01)
*H10H 20/01* (2025.01)
*H10H 20/825* (2025.01)

(52) U.S. Cl.
CPC .... *H10H 20/01335* (2025.01); *H10H 20/825* (2025.01)

(58) Field of Classification Search
CPC ....... H01L 33/007; H01L 33/32; H01L 33/06; H01L 33/0016; H01L 33/04; H01L 33/08
USPC .......................................................... 438/46
See application file for complete search history.

(56) References Cited

U.S. PATENT DOCUMENTS

| | | | | |
|---|---|---|---|---|
| 6,144,683 A * | 11/2000 | Floyd | .................... | H01S 5/4043 |
| | | | | 372/50.12 |
| 7,977,665 B2 * | 7/2011 | Moon | .................... | B82Y 20/00 |
| | | | | 257/14 |
| 8,257,993 B2 * | 9/2012 | Kang | ...................... | H01L 33/32 |
| | | | | 257/E21.085 |
| 8,895,956 B2 * | 11/2014 | Kimura | ................... | H01L 33/32 |
| | | | | 438/405 |
| 9,590,138 B2 * | 3/2017 | Cao | ........................ | H01L 33/007 |
| 11,152,537 B2 * | 10/2021 | Kim | ......................... | H01L 33/08 |
| 11,923,398 B2 * | 3/2024 | Armitage | ................ | H01L 33/32 |
| 2004/0066816 A1 | 4/2004 | Collins et al. | | |
| 2011/0204376 A1 * | 8/2011 | Su | ........................ | H01L 25/0756 |
| | | | | 438/46 |
| 2015/0207035 A1 * | 7/2015 | Tsai | ........................ | H01L 33/04 |
| | | | | 257/76 |
| 2019/0198709 A1 * | 6/2019 | Wildeson | ............. | H04B 10/572 |
| 2019/0348567 A1 | 11/2019 | Na et al. | | |

(Continued)

FOREIGN PATENT DOCUMENTS

| JP | 2004-128502 A | 4/2004 |
|---|---|---|
| JP | 2020-504909 A | 2/2020 |
| JP | 2021-106245 A | 7/2021 |

*Primary Examiner* — Vu A Vu
(74) *Attorney, Agent, or Firm* — Foley & Lardner LLP

(57) ABSTRACT

A method for manufacturing a light-emitting element includes: forming a first light-emitting part comprising a first n-type semiconductor layer, a first active layer on the first n-type semiconductor layer, and a first p-type semiconductor layer on the first active layer; forming an intermediate layer on the first light-emitting part; and forming a second light-emitting part on the intermediate layer, the second light-emitting part comprising a second n-type semiconductor layer, a second active layer on the second n-type semiconductor layer, and a second p-type semiconductor layer on the second active layer.

22 Claims, 9 Drawing Sheets

(56) References Cited

U.S. PATENT DOCUMENTS

| | | |
|---|---|---|
| 2021/0202790 A1 | 7/2021 | Hayashi |
| 2022/0037393 A1* | 2/2022 | Robin .................... H01L 33/06 |
| 2023/0051845 A1* | 2/2023 | Zollner .................. H01L 27/15 |

* cited by examiner

METHOD FOR MANUFACTURING LIGHT-EMITTING ELEMENT

CROSS-REFERENCE TO RELATED APPLICATIONS

This application is based upon and claims priority to Japanese Patent Application No. 2021-142418, filed on Sep. 1, 2021, the entire contents of which are incorporated herein by reference. This application also is based upon and claims priority to Japanese Patent Application No. 2022-137794, filed on Aug. 31, 2022, the entire contents of which are incorporated herein by reference.

FIELD

Embodiments of the present disclosure relate to a method for manufacturing a light-emitting element.

BACKGROUND

For example, JP-A 2004-128502 discusses a light-emitting element including a first light-emitting part that includes a first n-type layer, a first active layer, and a first p-type layer, a tunnel junction layer located on the first light-emitting part, and a second light-emitting part that is located on the tunnel junction layer and includes a second n-type layer, a second active layer, and a second p-type layer.

SUMMARY

According to one embodiment of the present disclosure, a method for manufacturing a light-emitting element includes forming a first light-emitting part that includes a first n-type semiconductor layer, a first active layer, and a first p-type semiconductor layer in this order upward from below. The method includes forming an intermediate layer on the first light-emitting part. The method includes forming a second light-emitting part on the intermediate layer. The second light-emitting part includes a second n-type semiconductor layer, a second active layer, and a second p-type semiconductor layer in this order upward from below. The first active layer includes a plurality of first well layers arranged in a vertical direction, and a first barrier layer positioned between two adjacent first well layers among the plurality of first well layers. The second active layer includes a plurality of second well layers arranged in the vertical direction, and a second barrier layer positioned between two adjacent second well layers among the plurality of second well layers. The first barrier layer is formed at a first temperature in the forming of the first light-emitting part. The second barrier layer is formed at a second temperature in the forming of the second light-emitting part. The second temperature is greater than the first temperature.

DETAILED DESCRIPTION

Figure 1:
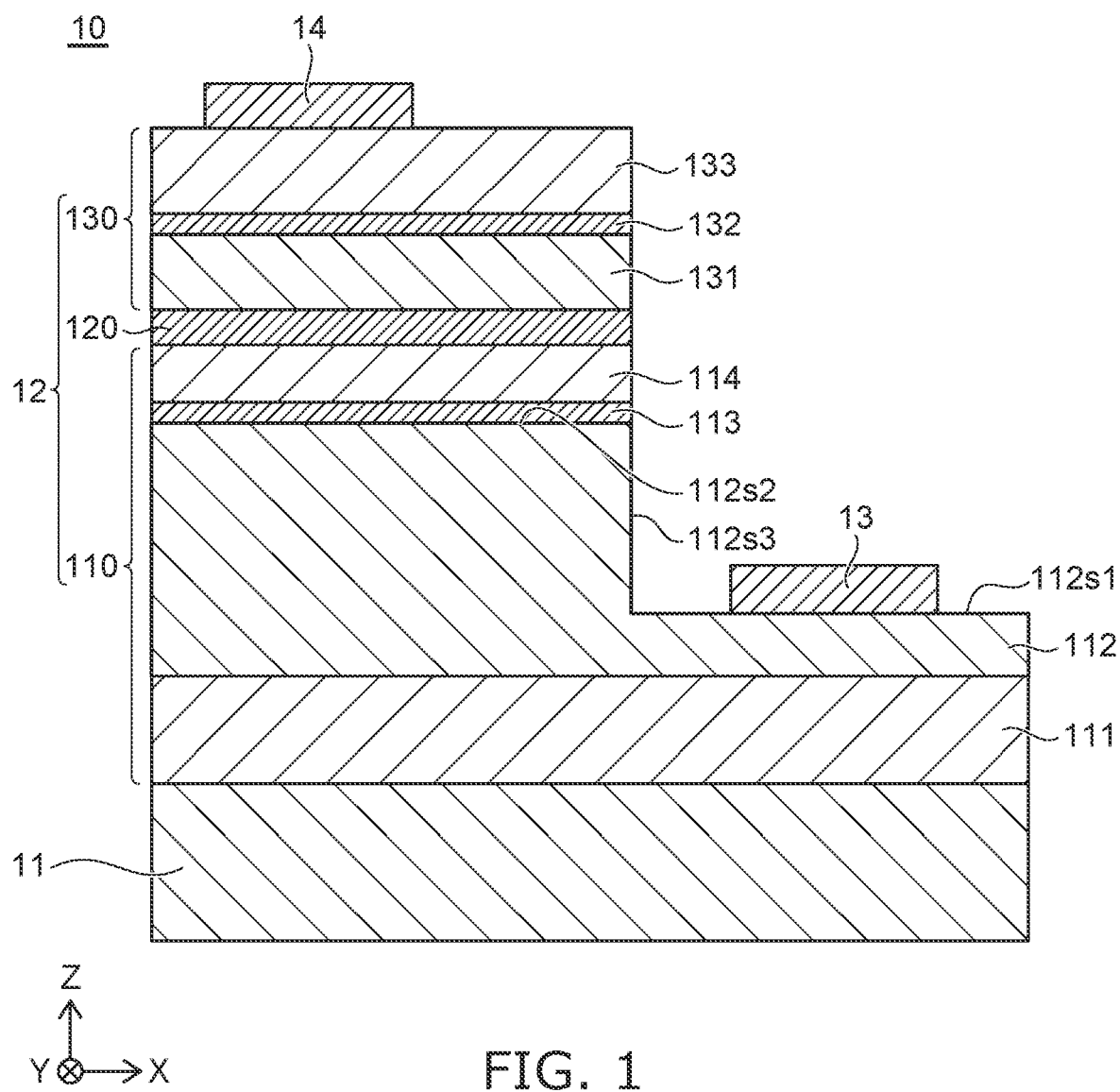
FIG. 1 is a cross-sectional view showing a light-emitting element according to an embodiment.

Exemplary embodiments will now be described with reference to the drawings. The drawings are schematic or conceptual, and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described with respect to a previous drawing are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction," the direction in which the Y-axis extends is taken as a "Y-direction," and the direction in which the Z-axis extends is taken as a "Z-direction." Although up is taken as the Z-direction and down is taken as the opposite direction for easier understanding of the description, these directions are relative and are independent of the direction of gravity.

FIG. 1 is a cross-sectional view showing a light-emitting element 10 according to the embodiment.

Figure 2A:
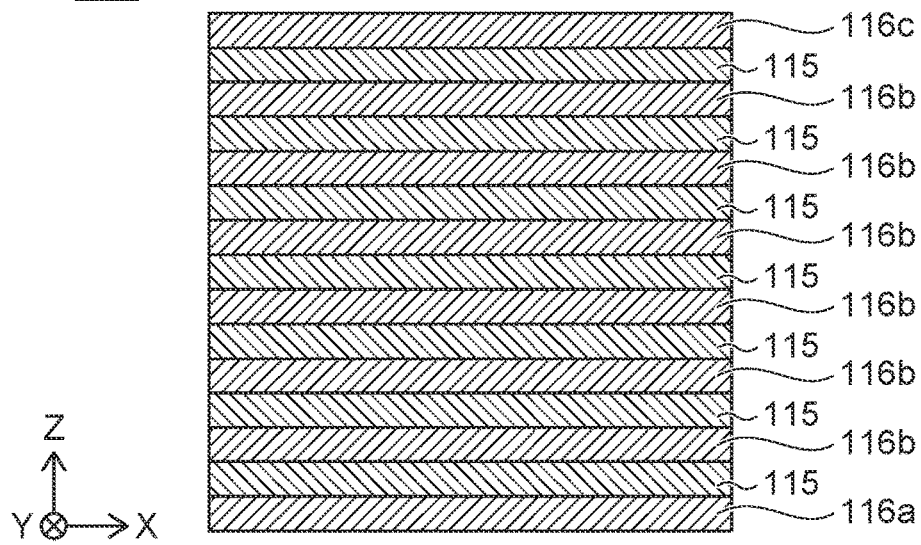
FIG. 2A is a cross-sectional view showing a first active layer of the light-emitting element according to the embodiment.

FIG. 2A is a cross-sectional view showing a first active layer 113 of the light-emitting element 10.

Figure 2B:
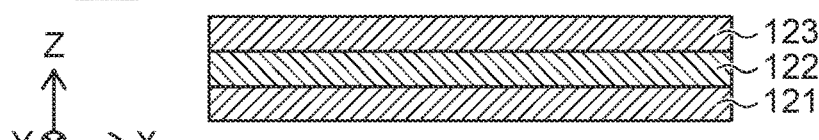
FIG. 2B is a cross-sectional view showing an intermediate layer of the light-emitting element according to the embodiment.

FIG. 2B is a cross-sectional view showing an intermediate layer 120 of the light-emitting element 10.

Figure 2C:
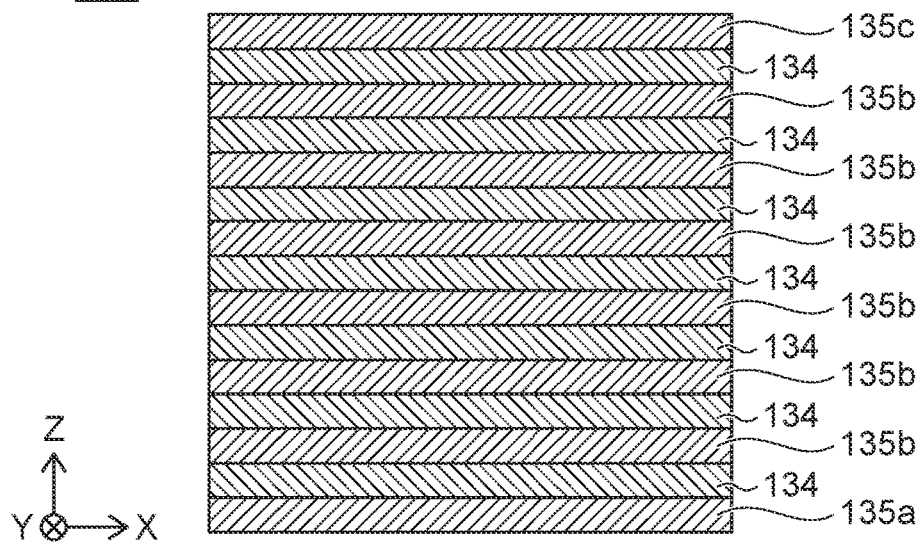
FIG. 2C is a cross-sectional view showing a second active layer of the light-emitting element according to the embodiment.

FIG. 2C is a cross-sectional view showing a second active layer 132 of the light-emitting element 10.

As shown in FIG. 1, the light-emitting element 10 includes a substrate 11, a semiconductor stacked body 12, an n-side electrode 13, and a p-side electrode 14.

The substrate 11 has a flat plate shape. The upper surface and the lower surface of the substrate 11 are substantially parallel to the XY plane. However, multiple protrusions may be formed in the upper surface of the substrate. For example, sapphire ($Al_2O_3$), silicon (Si), silicon carbide (SiC), gallium nitride (GaN), etc., are examples of the material of the substrate 11. According to the embodiment, the substrate 11 is made of sapphire. The semiconductor stacked body 12 is located on the substrate 11.

The semiconductor stacked body 12 is, for example, a stacked body in which multiple semiconductor layers made of nitride semiconductors are stacked. Here, "nitride semiconductor" is a semiconductor that includes nitrogen, and typically includes all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively.

The semiconductor stacked body 12 includes a first light-emitting part 110, the intermediate layer 120, and a second light-emitting part 130 in this order upward from below. The first light-emitting part 110 includes a first n-type semiconductor layer 112, the first active layer 113, and a first p-type semiconductor layer 114 in this order upward from below. The first active layer 113 is located on the first n-type semiconductor layer 112. The first p-type semiconductor layer 114 is located on the first active layer 113. The first light-emitting part 110 further includes a foundation layer 111 located under the first n-type semiconductor layer. The second light-emitting part 130 includes a second n-type semiconductor layer 131, the second active layer 132, and a second p-type semiconductor layer 133 in this order upward from below. The second active layer 132 is located on the second n-type semiconductor layer 131. The second p-type semiconductor layer 133 is located on the second active layer 132.

As shown in FIG. 2A, the first active layer 113 includes multiple first well layers 115 that are arranged in the vertical direction, and a first barrier layer 116b that is positioned between the multiple first well layers 115. The first active layer 113 further includes a fifth barrier layer 116c above a highest of the first well layers 115, and a sixth barrier layer 116a below a lowest of the first well layers 115. As shown in FIG. 2C, the second active layer 132 includes multiple second well layers 134 that are arranged in the vertical direction, and a second barrier layer 135b that is positioned between the multiple second well layers 134. The second active layer 132 further includes a third barrier layer 135c above a highest of the second well layers 134, and a fourth barrier layer 135a below a lowest of the second well layers 134. The components of the semiconductor stacked body 12 will now be elaborated.

As shown in FIG. 1, the foundation layer 111 of the first light-emitting part 110 is located on the substrate 11. The foundation layer 111 includes, for example, an undoped semiconductor layer. In the specification, "undoped" means that an n-type impurity and/or a p-type impurity is not intentionally doped. In other words, an undoped semiconductor layer is a semiconductor layer that is formed without supplying a raw material gas including an n-type impurity and/or a p-type impurity. "n-type impurity" means an impurity that forms donors. "p-type impurity" means an impurity that forms acceptors. There are cases where an undoped semiconductor layer that is adjacent to a layer intentionally doped with an n-type impurity and/or a p-type impurity includes the n-type impurity and/or the p-type impurity due to diffusion from the adjacent layer, etc.

The undoped semiconductor layer of the foundation layer 111 includes, for example, gallium nitride (GaN). The first n-type semiconductor layer 112 is located on the foundation layer 111. However, the first n-type semiconductor layer may be directly located on the substrate without including the foundation layer in the first light-emitting part.

The first n-type semiconductor layer 112 includes one or more n-type semiconductor layers. The n-type semiconductor layers of the first n-type semiconductor layer 112 include, for example, GaN doped with silicon (Si) as the n-type impurity. The n-type semiconductor layers of the first n-type semiconductor layer 112 may further include indium (In), aluminum (Al), etc.

It is sufficient for the first n-type semiconductor layer 112 to have the function of supplying electrons, and the first n-type semiconductor layer 112 may further include one or more undoped semiconductor layers. The undoped semiconductor layers of the first n-type semiconductor layer 112 include, for example, GaN.

The upper surface of the first n-type semiconductor layer 112 includes a first surface 112s1, a second surface 112s2, and a third surface 112s3. The first surface 112s1 is substantially parallel to the X-Y plane. The second surface 112s2 is positioned higher than the first surface 112s1 and is substantially parallel to the X-Y plane. When viewed in top-view, the second surface 112s2 is adjacent to the first surface 112s1 in the X-direction. The third surface 112s3 is positioned between the first surface 112s1 and the second surface 112s2 and is substantially parallel to the Y-Z plane.

The first active layer 113 is located on the second surface 112s2.

As shown in FIG. 2A, the sixth barrier layer 116a of the first active layer 113 is positioned lowest in the first active layer 113. The multiple first well layers 115 are arranged in the vertical direction on the sixth barrier layer 116a. The first barrier layer 116b is positioned between the adjacent first well layers 115. According to the embodiment, the number of the first well layers 115 included in the first active layer 113 is 7. The number of the first well layers 115 included in the first active layer 113 is, for example, not less than 2. For example, the number of first well layers included in the first active layer may be two, and the number of first barrier layers included in the first active layer may be one. The fifth barrier layer 116c is positioned on the highest of the first well layers 115. Thus, the first active layer 113 of the embodiment has a multi-quantum well structure that includes the multiple first well layers 115.

Each first well layer 115 is, for example, an undoped semiconductor layer that includes indium gallium nitride (InGaN). The first barrier layer 116b and the fifth barrier layer 116c each are, for example, undoped semiconductor layers including GaN. For example, the sixth barrier layer 116a has a stacked structure of an undoped semiconductor layer and a semiconductor layer including an n-type impurity. The undoped semiconductor layer of the sixth barrier layer 116a includes, for example, GaN. The semiconductor layer of the sixth barrier layer 116a that includes the n-type impurity includes, for example, InGaN doped with Si as the n-type impurity. The sixth barrier layer 116a has the function of supplying electrons to the first active layer 113.

As shown in FIG. 1, the first p-type semiconductor layer 114 is located on the first active layer 113.

The first p-type semiconductor layer 114 includes, for example, one or more p-type semiconductor layers. The p-type semiconductor layers of the first p-type semiconductor layer 114 include, for example, GaN doped with magnesium (Mg) as the p-type impurity. The p-type semiconductor layers of the first p-type semiconductor layer 114 may further include Al.

It is sufficient for the first p-type semiconductor layer 114 to have the function of supplying holes, and the first p-type semiconductor layer 114 may further include one or more undoped semiconductor layers. The undoped semiconductor layers of the first p-type semiconductor layer 114 include, for example, GaN. The undoped semiconductor layers of the first p-type semiconductor layer 114 may further include Al. The intermediate layer 120 is located on the first p-type semiconductor layer 114.

The intermediate layer 120 is located between the first light-emitting part 110 and the second light-emitting part 130. As shown in FIG. 2B, the intermediate layer 120 includes, for example, a third n-type semiconductor layer 121, a fourth n-type semiconductor layer 122, and a fifth n-type semiconductor layer 123 in this order upward from below.

The third n-type semiconductor layer 121 is located on the first p-type semiconductor layer 114. The third n-type semiconductor layer 121 includes, for example, GaN doped with Si as the n-type impurity. The n-type impurity concentration of the third n-type semiconductor layer 121 is greater than the n-type impurity concentration of the second n-type semiconductor layer 131 of the second light-emitting part 130 described below. Here, "the n-type impurity concentration of the third n-type semiconductor layer 121 is greater than the n-type impurity concentration of the second n-type semiconductor layer 131" means that the third n-type semiconductor layer 121 has a higher n-type impurity concentration than the semiconductor layer having the highest n-type impurity concentration among the semiconductor layers included in the second n-type semiconductor layer 131. This is similar for the fourth n-type semiconductor layer 122 as well. The n-type impurity concentration of the third n-type semiconductor layer 121 is, for example, not less than $2\times10^{20}/cm^3$ and not more than $1\times10^{21}/cm^3$.

The fourth n-type semiconductor layer 122 includes, for example, GaN doped with Si as the n-type impurity. The n-type impurity concentration of the fourth n-type semiconductor layer 122 is greater than that of the second n-type semiconductor layer 131 and less than that of the third n-type semiconductor layer 121.

The fifth n-type semiconductor layer 123 includes, for example, GaN doped with Si as the n-type impurity. The n-type impurity concentration of the fifth n-type semiconductor layer 123 is less than the n-type impurity concentrations of the third and fourth n-type semiconductor layers 121 and 122.

However, as long as an n-type impurity and/or a p-type impurity is included, the configuration of the intermediate layer is not limited to such a configuration. For example, the intermediate layer may include only the third n-type semiconductor layer. Also, the intermediate layer may include a p-type semiconductor layer that has a higher p-type impurity concentration than the semiconductor layer having the highest p-type impurity concentration among the semiconductor layers included in the first p-type semiconductor layer. When a p-type semiconductor layer is included in the intermediate layer, the p-type semiconductor layer includes, for example, GaN doped with Mg as the p-type impurity.

As shown in FIG. 1, the second n-type semiconductor layer 131 of the second light-emitting part 130 is located on the intermediate layer 120. The second n-type semiconductor layer 131 includes one or more n-type semiconductor layers. The n-type semiconductor layers of the second n-type semiconductor layer 131 include, for example, GaN doped with Si as the n-type impurity. The n-type semiconductor layers of the second n-type semiconductor layer 131 may further include In, Al, etc. The n-type impurity concentration of the second n-type semiconductor layer 131 is, for example, not less than $1\times10^{18}/cm^3$ and not more than $2\times10^{20}/cm^3$.

It is sufficient for the second n-type semiconductor layer 131 to have the function of supplying electrons, and the second n-type semiconductor layer 131 may further include one or more undoped semiconductor layers. The undoped semiconductor layers of the second n-type semiconductor layer 131 include, for example, GaN. The second active layer 132 is located on the second n-type semiconductor layer 131.

As shown in FIG. 2C, the fourth barrier layer 135a of the second active layer 132 is positioned lowest in the second active layer 132. The multiple second well layers 134 are arranged in the vertical direction on the fourth barrier layer 135a. The second barrier layer 135b is positioned in each region between the adjacent second well layers 134. According to the embodiment, the number of the second well layers 134 included in the second active layer 132 is 7. The number of the second well layers 134 included in the second active layer 132 is, for example, not less than 2. For example, the number of second well layers included in the second active layer may be two, and the number of second barrier layers included in the second active layer may be one. The third barrier layer 135c is positioned on the highest of the second well layers 134. Thus, the second active layer 132 of the embodiment has a multi-quantum well structure that includes the multiple second well layers 134.

Each second well layer 134 is, for example, an undoped semiconductor layer that includes InGaN. The second barrier layer 135b and the third barrier layer 135c each are, for example, undoped semiconductor layers that include GaN. For example, the fourth barrier layer 135a has a stacked structure of an undoped semiconductor layer and a semiconductor layer including an n-type impurity. The undoped semiconductor layer of the fourth barrier layer 135a includes, for example, GaN. The semiconductor layer of the fourth barrier layer 135a that includes the n-type impurity includes, for example, InGaN doped with Si as the n-type impurity.

The light that is emitted by the first and second active layers 113 and 132 is, for example, ultraviolet light or visible light. The light emission peak wavelength of the first active layer 113 and the light emission peak wavelength of the second active layer 132 can be equal. For example, the first active layer 113 and the second active layer 132 may emit blue light. The light emission peak wavelength of the first active layer 113 and the light emission peak wavelength of the second active layer 132 may be different. For example, the first active layer 113 may emit blue light, and the second active layer 132 may emit green light. The light emission peak wavelength of the blue light is, for example, not less than 430 nm and not more than 490 nm. The light emission peak wavelength of the green light is, for example, not less than 500 nm and not more than 540 nm.

As shown in FIG. 1, the second p-type semiconductor layer 133 is located on the second active layer 132. The second p-type semiconductor layer 133 includes, for example, one or more p-type semiconductor layers. The p-type semiconductor layers of the second p-type semiconductor layer 133 include, for example, GaN doped with Mg as the p-type impurity. The p-type semiconductor layers of the second p-type semiconductor layer 133 may further include Al.

It is sufficient for the second p-type semiconductor layer 133 to have the function of supplying holes, and the second p-type semiconductor layer 133 may further include one or more undoped semiconductor layers. The undoped semiconductor layers of the second p-type semiconductor layer 133 may include, for example, GaN. The undoped semiconductor layers of the second p-type semiconductor layer 133 may further include Al.

The n-side electrode 13 is located on the first surface 112s1 of the first n-type semiconductor layer 112. The n-side electrode 13 is electrically connected to the first n-type semiconductor layer 112. The p-side electrode 14 is located on the second p-type semiconductor layer 133. The p-side electrode 14 is electrically connected to the second p-type semiconductor layer 133. The first active layer 113 and the second active layer 132 are caused to emit light by applying a forward voltage between the n-side electrode 13 and the p-side electrode 14.

When a positive potential is applied to the p-side electrode 14 and a potential less than that of the p-side electrode 14 is applied to the n-side electrode 13, a reverse voltage is applied between the second n-type semiconductor layer 131 and the first p-type semiconductor layer 114. Therefore, the tunnel effect of the intermediate layer 120 is utilized to cause a current to flow between the second n-type semiconductor layer 131 and the first p-type semiconductor layer 114. The current is caused to flow by the electrons that exist in the valence band of the first p-type semiconductor layer 114 tunneling to the conduction band of the second n-type semiconductor layer 131.

To obtain such a tunnel effect, the intermediate layer 120 is formed of at least one of a p-type semiconductor layer having a higher p-type impurity concentration than the first p-type semiconductor layer 114 or an n-type semiconductor layer having a higher n-type impurity concentration than the second n-type semiconductor layer 131. A p-n junction is formed by such an intermediate layer 120. For example, a p-n junction is formed by the first p-type semiconductor layer 114 and the intermediate layer 120 that includes the third n-type semiconductor layer 121 doped with a high-concentration n-type impurity. For example, a p-n junction is formed by the second n-type semiconductor layer 131 and the intermediate layer 120 that includes a p-type semiconductor layer doped with a high-concentration p-type impurity. For example, a p-n junction is formed by the intermediate layer 120 having a stacked structure that includes the third n-type semiconductor layer 121 doped with a high-concentration n-type impurity and a p-type semiconductor layer doped with a high-concentration p-type impurity. The widths of the depletion layers formed by the p-n junctions described above can be narrower as the concentrations of the impurities of each conductivity type included in the first p-type semiconductor layer 114, the intermediate layer 120, and the second n-type semiconductor layer 131 increase. Also, when the voltage is applied, the electrons that exist in the valence band of the first p-type semiconductor layer 114 tunnel through the depletion layers and move more easily to the conduction band of the second n-type semiconductor layer 131 as the width of the depletion layers decrease.

A method for manufacturing the light-emitting element 10 will now be described.

Figure 3:
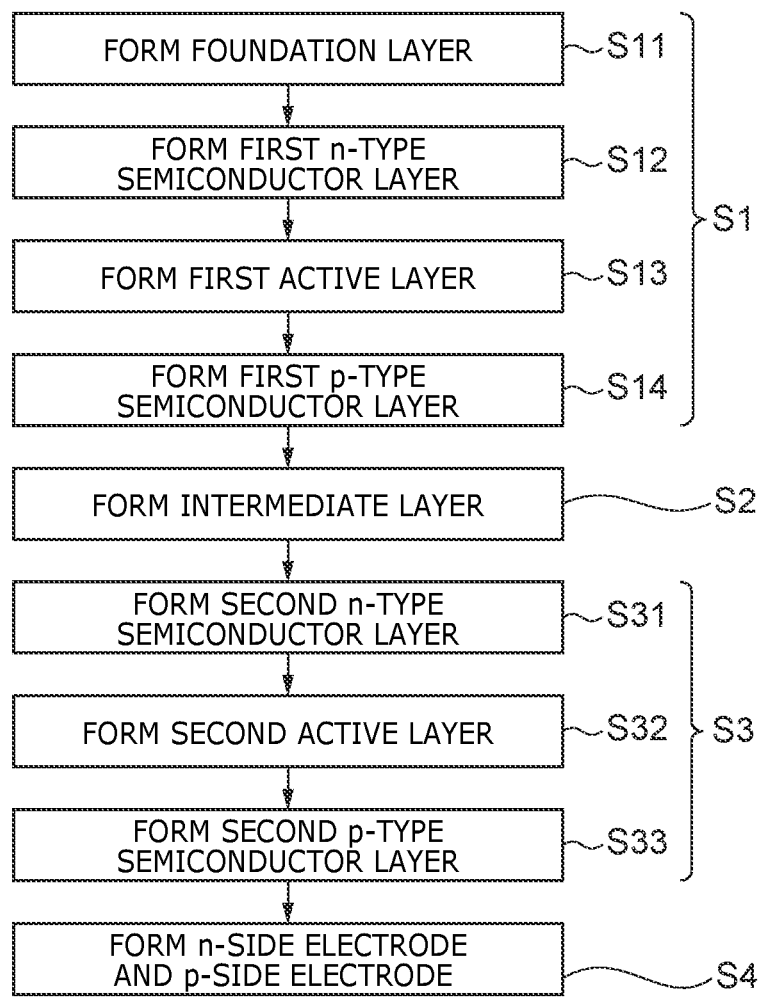
FIG. 3 is a flowchart showing the method for manufacturing the light-emitting element according to the embodiment.

FIG. 3 is a flowchart showing the method for manufacturing the light-emitting element 10 according to the embodiment.

Figure 4A:
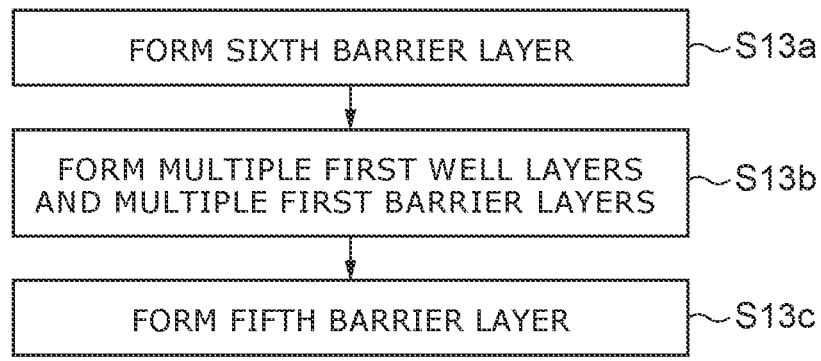
FIG. 4A is a flowchart showing details of the process of forming the first active layer of FIG. 3.

FIG. 4A is a flowchart showing details of the process of forming the first active layer 113 of FIG. 3.

Figure 4B:
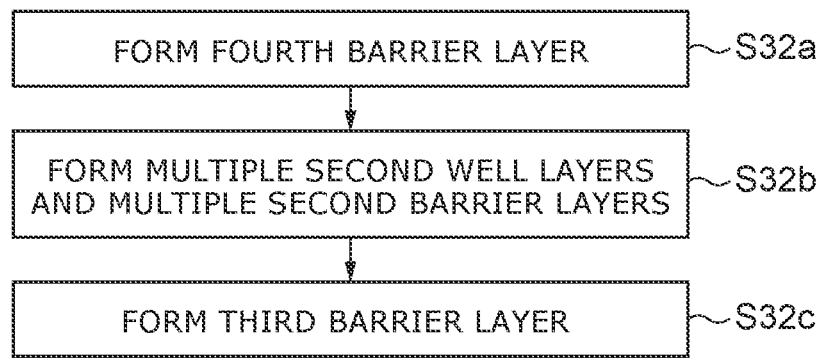
FIG. 4B is a flowchart showing details of the process of forming the second active layer of FIG. 3.

FIG. 4B is a flowchart showing details of the process of forming the second active layer 132 of FIG. 3.

Figure 5:
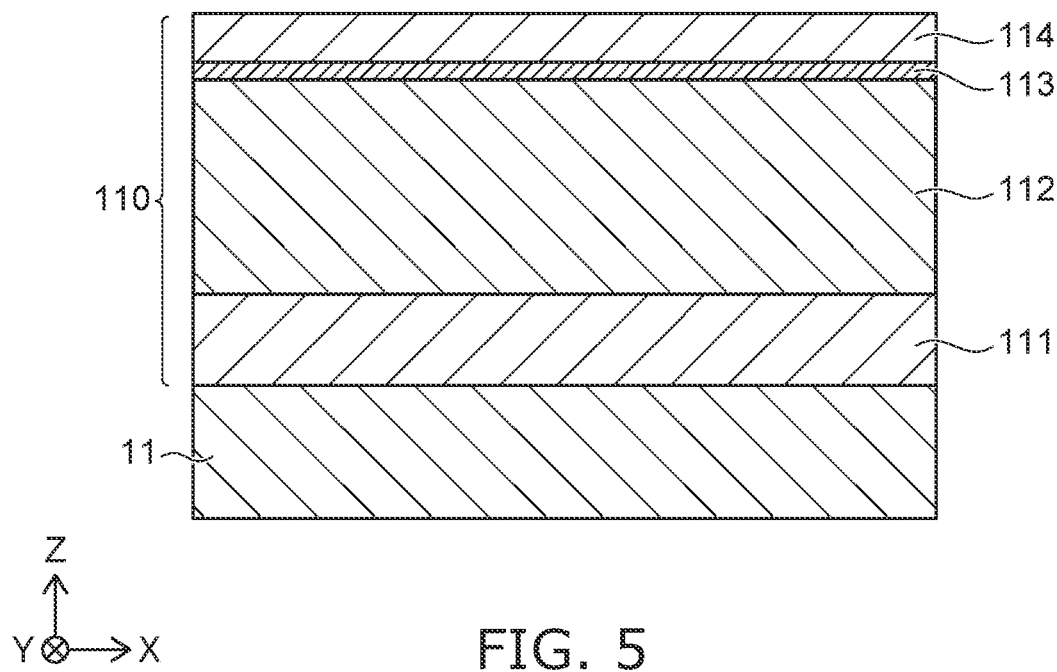
FIG. 5 is a cross-sectional view for describing manufacturing processes of the light-emitting element according to the embodiment.

FIG. 5 is a cross-sectional view for describing manufacturing processes of the light-emitting element 10 according to the embodiment.

Figure 6:
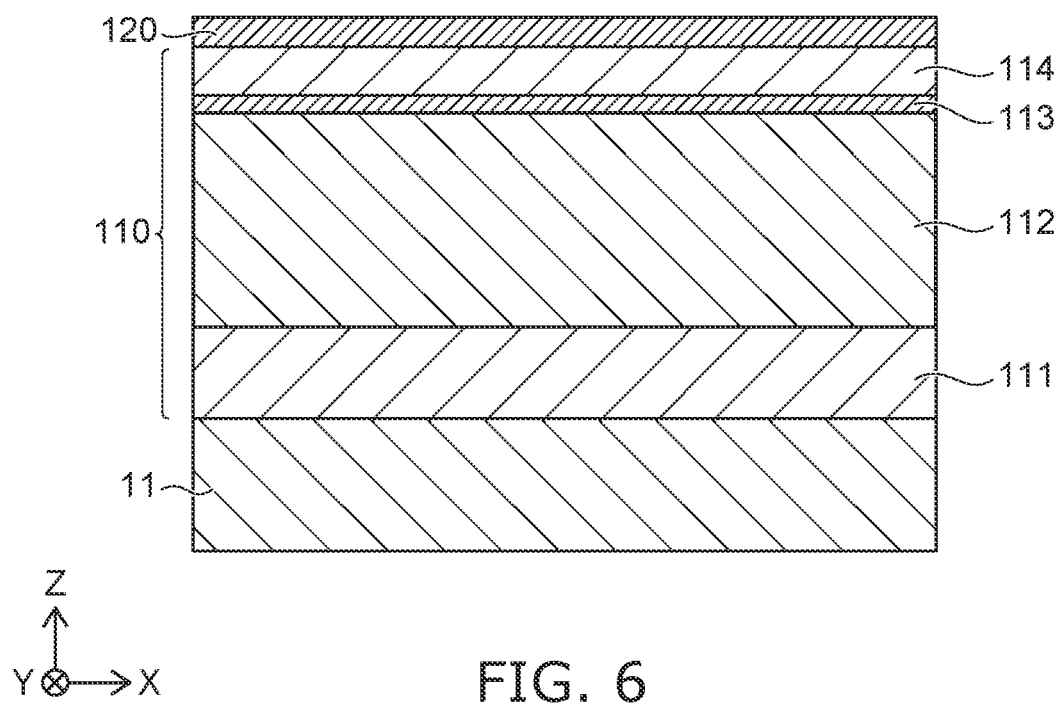
FIG. 6 is a cross-sectional view for describing manufacturing processes of the light-emitting element according to the embodiment.

FIG. 6 is a cross-sectional view for describing manufacturing processes of the light-emitting element 10 according to the embodiment.

Figure 7:
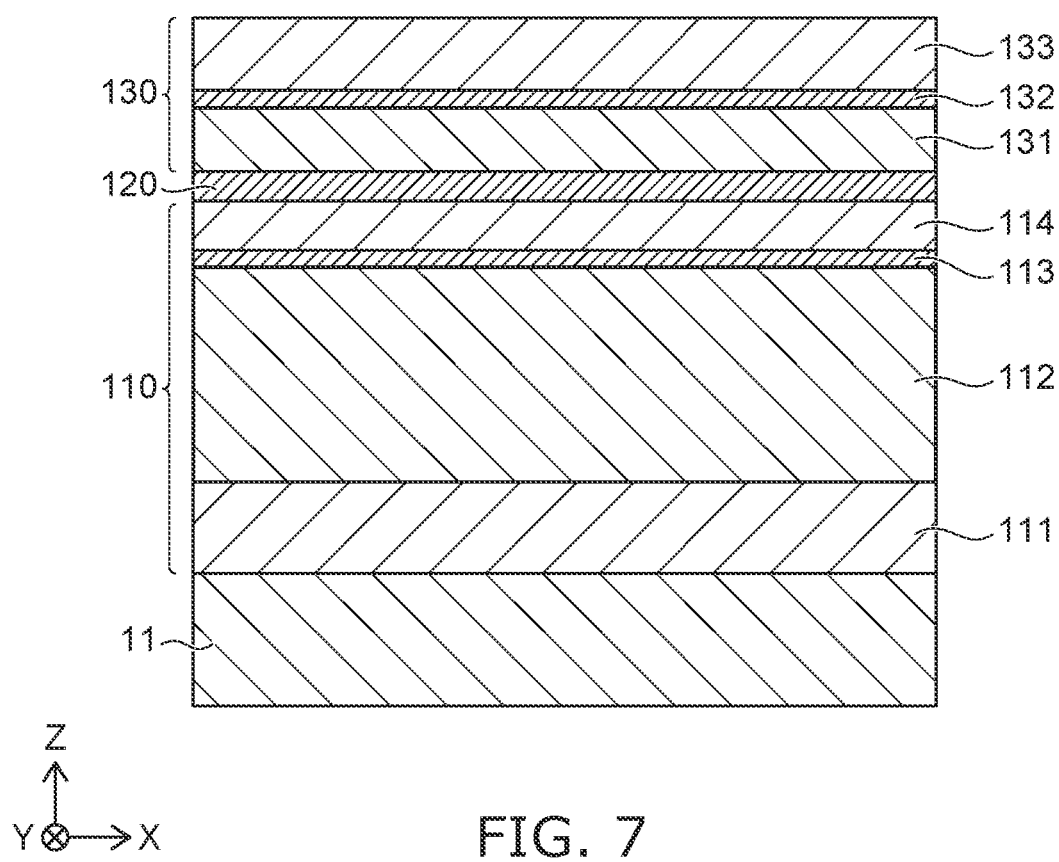
FIG. 7 is a cross-sectional view for describing manufacturing processes of the light-emitting element according to the embodiment.

FIG. 7 is a cross-sectional view for describing manufacturing processes of the light-emitting element 10 according to the embodiment.

Figure 8:
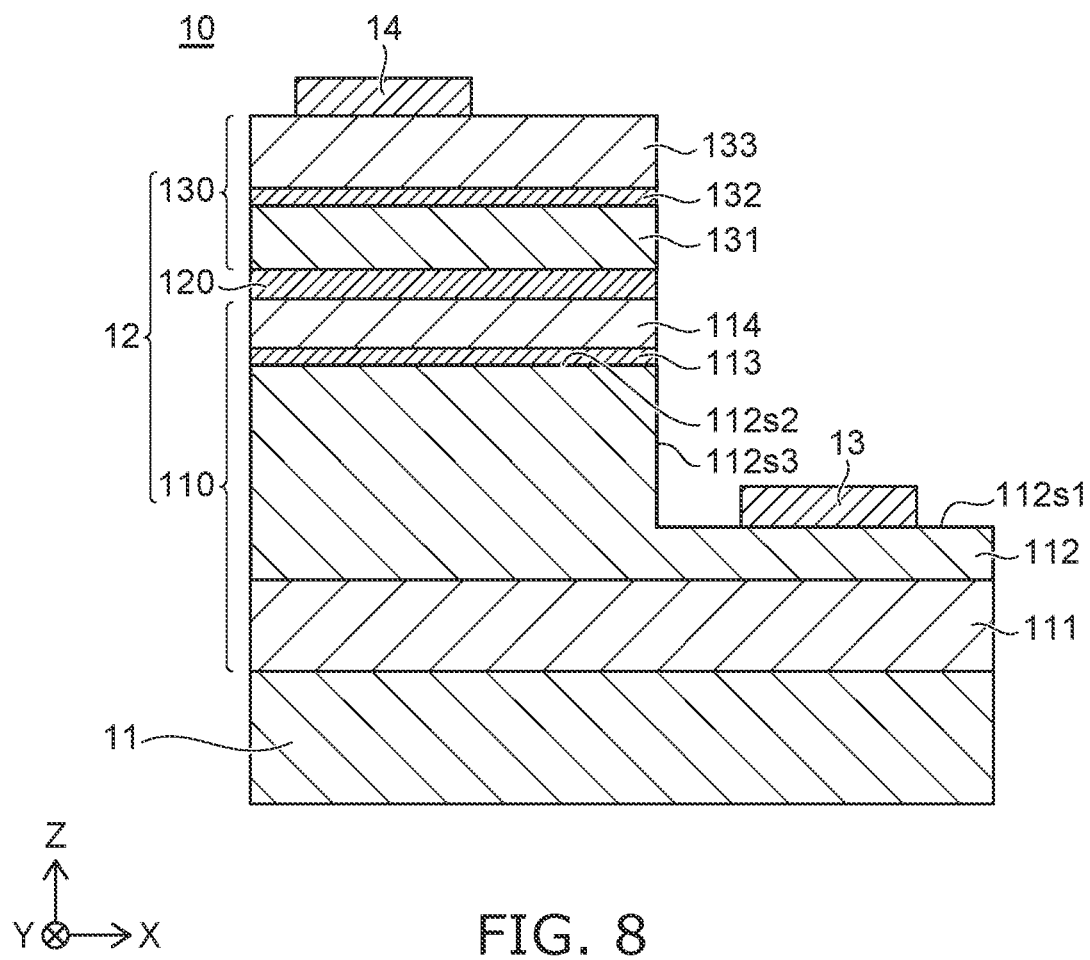
FIG. 8 is a cross-sectional view for describing manufacturing processes of the light-emitting element according to the embodiment.

FIG. 8 is a cross-sectional view for describing manufacturing processes of the light-emitting element 10 according to the embodiment.

Figure 9A:
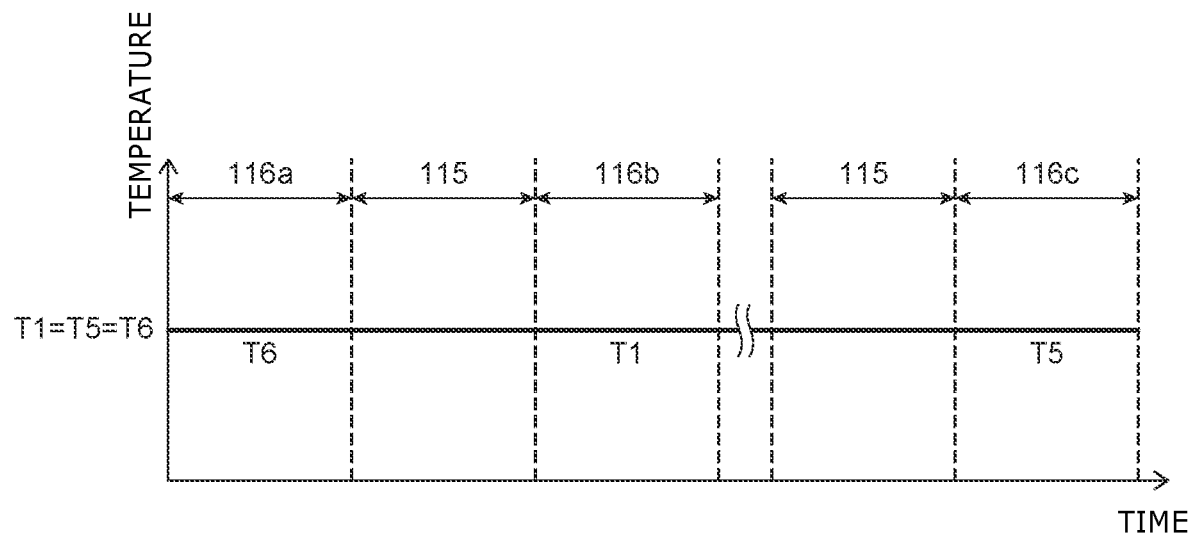
FIG. 9A is a graph showing a temporal change of temperature inside a furnace when forming the first active layer of the light-emitting element according to the embodiment.

FIG. 9A is a graph showing the temporal change of the temperature inside a furnace when forming the first active layer 113 of the light-emitting element 10 according to the embodiment.

Figure 9B:
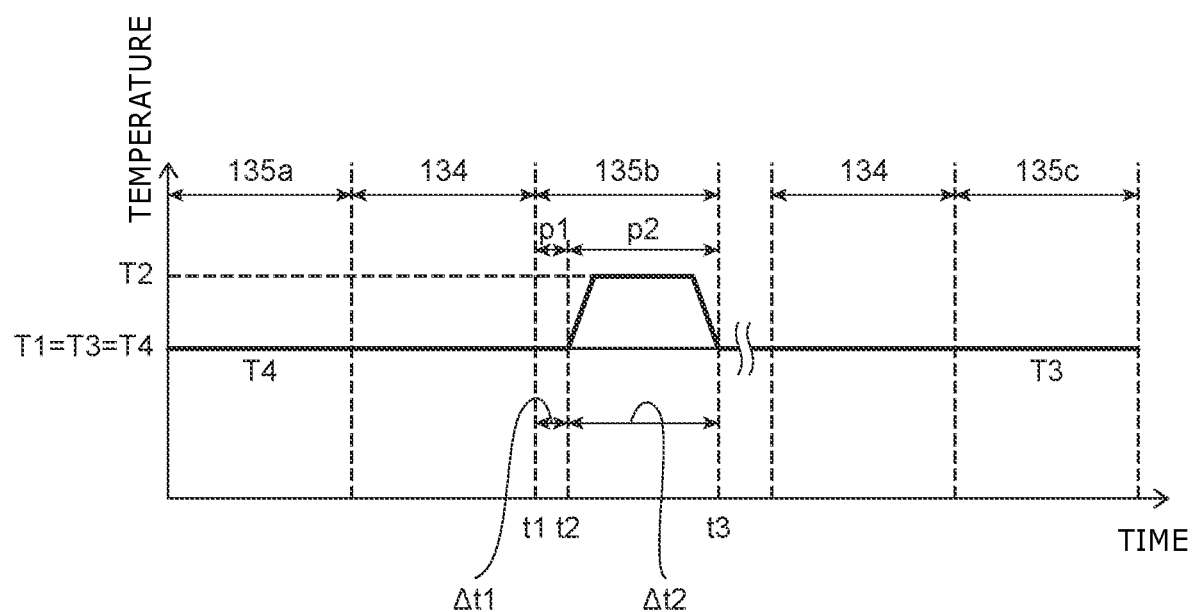
FIG. 9B is a graph showing a temporal change of temperature inside a furnace when forming the second active layer of the light-emitting element according to the embodiment.

FIG. 9B is a graph showing the temporal change of the temperature inside a furnace when forming the second active layer 132 of the light-emitting element 10 according to the embodiment.

Generally speaking, the method for manufacturing the light-emitting element 10 is as shown in FIG. 3. The method for manufacturing the light-emitting element 10 includes a process S1 of forming the first light-emitting part 110, a process S2 of forming the intermediate layer 120, a process S3 of forming the second light-emitting part 130, and a process S4 of forming the n-side electrode 13 and the p-side electrode 14.

The first light-emitting part 110, the intermediate layer 120, and the second light-emitting part 130 that are included in the semiconductor stacked body 12 are formed by, for example, MOCVD (metal organic chemical vapor deposition) inside a furnace having adjustable pressure and temperature. Specifically, the semiconductor stacked body 12 is formed by supplying a carrier gas and a raw material gas to the furnace. For example, hydrogen ($H_2$) gas, nitrogen ($N_2$) gas, etc., can be used as the carrier gas.

The raw material gas is appropriately selected according to the semiconductor layer to be formed. When a semiconductor layer that includes Ga is formed, for example, a raw material gas that includes Ga such as trimethylgallium (TMG) gas, triethylgallium (TEG) gas, or the like is used. When forming a semiconductor layer that includes N, for example, a raw material gas that includes N such as ammonia ($NH_3$) gas or the like is used. When forming a semiconductor layer that includes Al, for example, a raw material gas that includes Al such as trimethylaluminum (TMA) gas or the like is used. When forming a semiconductor layer that includes In, for example, a raw material gas that includes In such as trimethylindium (TMI) or the like is used. When forming a semiconductor layer that includes Si, for example, a gas that includes Si such as monosilane ($SiH_4$) gas or the like is used. When forming a semiconductor layer that includes Mg, for example, a raw material gas that includes Mg such as bis cyclopentadienyl magnesium ($Cp_2Mg$) gas or the like is used. Hereinbelow, the supply of a raw material gas that includes one element and a raw material gas that includes another element to the furnace also is called simply "supplying a raw material gas that includes one element and another element." The processes will now be elaborated.

First, the process S1 of forming the first light-emitting part 110 is performed.

The process S1 of forming the first light-emitting part 110 includes a process S11 of forming the foundation layer 111, a process S12 of forming the first n-type semiconductor layer 112, a process S13 of forming the first active layer 113, and a process S14 of forming the first p-type semiconductor layer 114.

In the process S11 of forming the foundation layer 111, a carrier gas and a raw material gas that correspond to the foundation layer 111 are supplied to the furnace. Thereby, the foundation layer 111 is formed on the substrate 11.

In the process S12 of forming the first n-type semiconductor layer 112, a carrier gas and a raw material gas that correspond to the first n-type semiconductor layer 112 are supplied to the furnace. Thereby, the first n-type semiconductor layer 112 is formed on the foundation layer 111.

As shown in FIG. 4A, the process S13 of forming the first active layer 113 includes a process S13a of forming the sixth barrier layer 116a, a process S13b of forming the multiple first well layers 115 and the multiple first barrier layers 116b, and a process S13c of forming the fifth barrier layer 116c.

In the process S13a of forming the sixth barrier layer 116a, for example, an undoped semiconductor layer and an n-type semiconductor layer are formed on the first n-type semiconductor layer 112. The undoped semiconductor layer is formed by supplying a carrier gas, a raw material gas that includes Ga as a Group III element, and a raw material gas that includes N as a Group V element to the furnace. At this time, a raw material gas that includes an n-type impurity or a p-type impurity is not supplied. The n-type semiconductor layer is formed by supplying a carrier gas, a raw material gas that includes In and Ga as Group III elements, a raw material gas that includes N as a Group V element, and a raw material gas that includes Si as an n-type impurity to the furnace.

As shown in FIG. 9A, the sixth barrier layer 116a is formed at a sixth temperature T6. Here, the "sixth temperature" means the highest temperature measured by a thermocouple located at the vicinity of the substrate 11 without considering the rising temperature or the falling temperature. This is similar for a first temperature T1, a second temperature T2, a third temperature T3, a fourth temperature T4, a fifth temperature T5, the temperature when forming the first well layer 115, and the temperature when forming the second well layer 134 described below. It is favorable for the sixth temperature T6 to be not less than 820° C. and not more than 870° C.

In the process S13b of forming the first well layer 115 and the first barrier layer 116b, first, a carrier gas, a raw material gas that includes In and Ga as Group III elements, and a raw material gas that includes N as a Group V element are supplied to the furnace. At this time, a raw material gas that includes an n-type impurity or a p-type impurity is not supplied. Thereby, the first well layer 115 that includes undoped InGaN is formed on the sixth barrier layer 116a. Then, a carrier gas, a raw material gas that includes Ga as a Group III element, and a raw material gas that includes N as a Group V element are supplied to the furnace. At this time, a raw material gas that includes an n-type impurity or a p-type impurity is not supplied. Thereby, the first barrier layer 116b that includes undoped GaN is formed on the first well layer 115. According to the embodiment, the formation of the first well layer 115 and the formation of the first barrier layer 116b are alternately performed multiple times; the first well layer 115 is formed on the first barrier layer 116b that is finally formed. Thereby, a stacked body in which the first barrier layers 116b are located between the multiple first well layers 115 arranged in the vertical direction is formed on the sixth barrier layer 116a.

The first barrier layer 116b is formed at the first temperature T1. As in the embodiment, when three or more first well layers 115 are used and two or more first barrier layers 116b are used, it is sufficient for the temperature when forming at least one first barrier layer 116b to be the "first temperature T1." This is similar for the second temperature T2 when forming the second barrier layer 135b described below.

It is favorable for the first temperature T1 to be not less than 820° C. and not more than 870° C. It is favorable for the difference between the first temperature T1 and the sixth temperature T6 to be not more than 10° C. According to the embodiment as shown in FIG. 9A, the first temperature T1 and the sixth temperature T6 are substantially equal.

It is favorable for the temperature when forming each first well layer 115 to be not less than 820° C. and not more than 870° C. It is favorable for the difference between the temperatures when forming the first temperature T1 and each first well layer 115 to be not more than 10° C. According to the embodiment as shown in FIG. 9A, the temperatures when forming the first temperature T1 and each first well layer 115 are substantially equal.

In the process S13c of forming the fifth barrier layer 116c, a carrier gas, a raw material gas that includes Ga as a Group III element, and a raw material gas that includes N as a Group V element are supplied to the furnace. At this time, a raw material gas that includes an n-type impurity or a p-type impurity is not supplied. Thereby, the fifth barrier layer 116c that includes an undoped GaN is formed on the highest of the first well layers 115.

The fifth barrier layer 116c is formed at the fifth temperature T5. It is favorable for the fifth temperature T5 to be, for example, not less than 820° C. and not more than 870° C. It is favorable for the difference between the first temperature T1 and the fifth temperature T5 to be not more than 10° C. According to the embodiment as shown in FIG. 9A, the first temperature T1 and the fifth temperature T5 are substantially equal.

Thus, according to the embodiment as shown in FIG. 9A, the sixth barrier layer 116a, the multiple first well layers 115, the multiple first barrier layers 116b, and the fifth barrier layer 116c are formed at a substantially constant temperature. However, the temperatures when forming these layers may not be constant.

When forming the layers hereinbelow, the value of the molar flow rate of the raw material gas including the Group V element divided by the molar flow rate of the raw material gas including the Group III element is called the value of the V/III ratio. The values of the V/III ratio when forming the sixth barrier layer 116a, the first well layer 115, the first barrier layer 116b, and the fifth barrier layer 116c can be modified as appropriate.

In the process S14 of forming the first p-type semiconductor layer 114, a carrier gas and a raw material gas that correspond to the first p-type semiconductor layer 114 are supplied to the furnace. Thereby, the first p-type semiconductor layer 114 is formed on the fifth barrier layer 116c.

Thus, as shown in FIG. 5, the first light-emitting part 110 that includes the foundation layer 111, the first n-type semiconductor layer 112, the first active layer 113, and the first p-type semiconductor layer 114 is formed on the substrate 11.

Then, the process S2 of forming the intermediate layer 120 is performed.

In the process S2 of forming the intermediate layer 120, for example, a carrier gas, a raw material gas that includes Ga and N, and a raw material gas that includes Si as an n-type impurity are supplied to the furnace. At this time, the flow rate of the raw material gas including Si is reduced in stages. Thereby, the third n-type semiconductor layer 121, the fourth n-type semiconductor layer 122 that has a lower n-type impurity concentration than the third n-type semiconductor layer 121, and the fifth n-type semiconductor layer 123 that has a lower n-type impurity concentration than the fourth n-type semiconductor layer 122 are formed on the first light-emitting part 110 in this order. Thus, as shown in FIG. 6, the intermediate layer 120 is formed on the first light-emitting part 110.

The intermediate layer 120 may be formed by MBE (Molecular Beam Epitaxy) instead of MOCVD.

Because the intermediate layer 120 thus includes the third n-type semiconductor layer 121 that has a high n-type impurity concentration, there are cases where the crystallinity of the intermediate layer 120 degrades.

Then, the process S3 of forming the second light-emitting part 130 is performed.

As shown in FIG. 3, the process S3 of forming the second light-emitting part 130 includes a process S31 of forming the second n-type semiconductor layer 131, a process S32 of forming the second active layer 132, and a process S33 of forming the second p-type semiconductor layer 133.

In the process S31 of forming the second n-type semiconductor layer 131, a carrier gas and a raw material gas that correspond to the second n-type semiconductor layer 131 are supplied to the furnace. Thereby, the second n-type semiconductor layer 131 is formed on the intermediate layer 120.

As shown in FIG. 4B, the process S32 of forming the second active layer 132 includes a process S32a of forming the fourth barrier layer 135a, a process S32b of forming the multiple second well layers 134 and the multiple second barrier layers 135b, and a process S32c of forming the third barrier layer 135c.

In the process S32a of forming the fourth barrier layer 135a, for example, an undoped semiconductor layer and an n-type semiconductor layer are formed on the second n-type semiconductor layer 131. The undoped semiconductor layer is formed by supplying a carrier gas, a raw material gas that includes Ga as a Group III element, and a raw material gas that includes N as a Group V element to the furnace. At this time, a raw material gas that includes an n-type impurity or a p-type impurity is not supplied. The n-type semiconductor layer is formed by supplying a carrier gas, a raw material gas that includes In and Ga as Group III elements, a raw material gas that includes N as a Group V element, and a raw material gas that includes Si as an n-type impurity to the furnace.

The fourth barrier layer 135a is formed at the fourth temperature T4. It is favorable for the fourth temperature T4 to be not less than 820° C. and not more than 870° C. It is favorable for the difference between the fourth temperature T4 and the first temperature T1 to be not more than 10° C. According to the embodiment as shown in FIG. 9B, the fourth temperature T4 is substantially equal to the first temperature T1.

In the process S32b of forming the second well layer 134 and the second barrier layer 135b, first, a carrier gas, a raw material gas that includes In and Ga as Group III elements, and a raw material gas that includes N as a Group V element are supplied to the furnace. At this time, a raw material gas that includes an n-type impurity or a p-type impurity is not supplied. Thereby, the second well layer 134 that includes undoped InGaN is formed on the fourth barrier layer 135a. Then, a carrier gas, a raw material gas that includes Ga as a Group III element, and a raw material gas that includes N as a Group V element are supplied to the furnace. At this time, a raw material gas that includes an n-type impurity or a p-type impurity is not supplied. Thereby, the second barrier layer 135b that includes undoped GaN is formed on the second well layer 134. According to the embodiment, the formation of the second well layer 134 and the formation of the second barrier layer 135b are alternately performed multiple times, and the second well layer 134 is formed on the second barrier layer 135b that is finally formed. Thereby, a stacked body in which the second barrier layers 135b are located between the multiple second well layers 134 arranged in the vertical direction is formed on the fourth barrier layer 135a.

When the intermediate layer 120 is formed to have degraded crystallinity, there are cases where the second active layer 132 inherits the crystallinity of the intermediate layer 120, and the crystallinity of the second active layer 132 degrades. In particular, the luminous efficiency of the light-emitting element 10 easily decreases when the crystallinity of the second well layer 134 that contributes to the light emission degrades. Conversely, according to the embodiment, the second temperature T2 when forming the second barrier layer 135b positioned above the intermediate layer 120 is greater than the first temperature T1 when forming the first barrier layer 116b. Therefore, the surface state of the second barrier layer 135b can be better than when the second barrier layer is formed at the first temperature T1. The crystallinity of the second well layer 134 formed on the second barrier layer 135b can be improved thereby. As a result, the luminous efficiency of the light-emitting element 10 can be increased.

It is favorable for the second temperature T2 to be not less than 870° C. and not more than 970° C. Also, it is favorable for the difference between the second temperature T2 and the first temperature T1 to be not less than 50° C. and not more than 100° C.

According to the embodiment, the temperature when forming the second well layer 134 is less than the second temperature T2. The thermal load on the first and second well layers 115 and 134 can be reduced thereby.

It is favorable for the temperature when forming the second well layer 134 to be not less than 820° C. and not more than 870° C. It is favorable for the difference between the temperature when forming the second well layer 134 and the temperature when forming the first well layer 115 to be not more than 10° C. According to the embodiment as shown in FIG. 9B, the temperature when forming the second well layer 134 is substantially equal to the first temperature T1, i.e., the temperature when forming the first well layer 115.

According to the embodiment, the temperature when forming each second barrier layer 135b is not constant and changes with time. Specifically, the second barrier layer 135b includes a first portion p1, and a second portion p2 that is formed on the first portion p1 at a temperature that is greater than the temperature when forming the first portion p1. Accordingly, the second temperature T2 corresponds to the maximum temperature when forming the second portion p2 of the second barrier layer 135b. Thus, by setting the temperature when forming the second portion p2 to be greater than the temperature when forming the first portion p1, the crystallinity of the second portion p2 that becomes the foundation of the second well layer 134 to be formed next can be improved while reducing the thermal decomposition of the In included in the second well layer 134 positioned directly under the first portion p1.

It is favorable for the temperature when forming the first portion p1 to be not less than 820° C. and not more than 870° C. It is favorable for the difference between the first temperature T1 and the temperature when forming the first portion p1 to be not more than 10° C.

According to the embodiment, the temperature inside the furnace is set to be substantially equal to the first temperature T1 from a time t1 at the start of the formation of each second barrier layer 135b until a prescribed interval Δt1 has elapsed. The first portion p1 is formed between the time t1 and a time t2 at which the prescribed interval Δt1 has elapsed. Then, at the time t2 at which the prescribed interval Δt1 has elapsed from the time t1 of the start of the formation of each second barrier layer 135b, the temperature inside the furnace is increased toward the second temperature T2 that is greater than the first temperature T1, and the temperature inside the furnace is set to the second temperature T2. Subsequently, before a time t3 at which the formation of the second well layer 134 is started, the temperature inside the furnace is cooled to the first temperature T1 which is the temperature when forming the second well layer 134. The second portion p2 is formed between the time t2 and the time t3 at which a prescribed interval Δt2 has elapsed. Within the prescribed interval Δt2, it is favorable for the second portion p2 not to be formed while increasing or reducing the temperature inside the furnace, and it is favorable for the second portion p2 to be formed while the temperature inside the furnace is at the second temperature T2. The degradation of the crystallinity of the second portion p2 due to the temperature change inside the furnace can be reduced thereby.

Because the prescribed interval Δt2 that corresponds to the time to form the second portion p2 is greater than the prescribed interval Δt1 that corresponds to the time to form the first portion p1, the thickness of the second portion p2 is greater than the thickness of the first portion p1. As a result, the crystallinity of the second portion p2 that becomes the foundation of the second well layer 134 to be formed next is easily improved while reducing the thermal decomposition of the In included in the second well layer 134 positioned directly under the first portion p1. It is favorable for the thickness of the first portion p1 to be not less than 0.5 nm and not more than 1.5 nm. It is favorable for the thickness of the second portion p2 to be not less than 2.0 nm and not more than 4.0 nm. Also, it is favorable for the difference between the thickness of the first portion p1 and the thickness of the second portion p2 to be not less than 0.5 nm and not more than 3.5 nm.

The fourth temperature T4 when forming the fourth barrier layer 135a described above is less than the second temperature T2. For example, the thermal load on the first light-emitting part 110 positioned below the fourth barrier layer 135a can be reduced thereby.

In the process S32c of forming the third barrier layer 135c, a carrier gas, a raw material gas that includes Ga as a Group III element, and a raw material gas that includes N as a Group V element are supplied to the furnace. Thereby, the third barrier layer 135c that includes undoped GaN is formed on the highest of the second well layers 134.

Because the second well layer 134 is not formed on the third barrier layer 135c, it is unnecessary to improve the surface state of the third barrier layer 135c to improve the crystallinity of the second well layer 134. The thermal load on the first and second active layers 113 and 132 can be reduced by forming the third barrier layer 135c at the third temperature T3 that is less than the second temperature T2.

The third temperature T3 is, for example, not less than 820° C. and not more than 870° C. It is favorable for the difference between the third temperature T3 and the first temperature T1 to be not more than 10° C. According to the embodiment as shown in FIG. 9B, the third temperature T3 is substantially equal to the first temperature T1.

The temporal change of the temperature when forming the second active layer is not limited to the temporal change of the temperature shown in FIG. 9A. For example, the second barrier layer may be formed at a substantially constant temperature.

When the crystallinity of the intermediate layer 120 degrades and the second active layer 132 inherits the crystallinity of the intermediate layer 120, dislocations and the like cause concave pits to form in the surfaces of the layers of the second active layer 132, and the diameters of the pits easily become large. Conversely, according to the embodiment, the value of the V/III ratio when forming the second barrier layer 135b is less than the value of the V/III ratio when forming the second well layer 134. Thereby, the second barrier layer 135b is easily grown in directions crossing the Z-direction. As a result, the concave pits are easily filled when forming the second barrier layer 135b, and the surface state of the second barrier layer 135b on which the second well layer 134 is formed can be improved. However, the magnitude relationship between the value of the V/III ratio when forming the second barrier layer and the value of the V/III ratio when forming the second well layer is not limited to that described above.

The values of the V/III ratio when forming the second well layer 134, the fourth barrier layer 135a, and the third barrier layer 135c are substantially equal to the values of the V/III ratio when forming the layers of the first active layer 113. However, the values of the V/III ratio when forming the second well layer, the fourth barrier layer, and the third barrier layer may be different from the values of the V/III ratio when forming the layers of the first active layer.

In the process S33 of forming the second p-type semiconductor layer 133, a carrier gas and a raw material gas that correspond to the second p-type semiconductor layer 133 are supplied to the furnace. Thereby, the second p-type semiconductor layer 133 is formed on the third barrier layer 135c.

Thus, as shown in FIG. 7, the second light-emitting part 130 that includes the second n-type semiconductor layer 131, the second active layer 132, and the second p-type semiconductor layer 133 is formed on the intermediate layer 120.

Then, the process S4 of forming the n-side electrode 13 and the p-side electrode 14 is performed.

In the process S4 of forming the n-side electrode 13 and the p-side electrode 14, first, as shown in FIG. 8, the first and third surfaces 112s1 and 112s3 of the first n-type semiconductor layer 112 are exposed from under the first active layer 113, the first p-type semiconductor layer 114, the intermediate layer 120, and the second light-emitting part 130 by removing a portion of the semiconductor stacked body 12. For example, the portion of the semiconductor stacked body 12 can be removed by selective etching using a resist.

Then, the n-side electrode 13 is formed on the exposed first surface 112s1. Also, the p-side electrode 14 is formed on the second p-type semiconductor layer 133. For example, the n-side electrode 13 and the p-side electrode 14 can be formed by sputtering or vapor deposition.

Thus, the light-emitting element 10 can be obtained. However, the method for manufacturing the light-emitting element is not limited to the method described above. For example, the method for manufacturing the light-emitting element may not include the process of forming the foundation layer, and the first n-type semiconductor layer may be directly formed on the substrate.

The method for manufacturing the light-emitting element 10 according to the embodiment includes the process S1 of forming the first light-emitting part 110 that includes the first n-type semiconductor layer 112, the first active layer 113, and the first p-type semiconductor layer in this order upward from below, the process S2 of forming the intermediate layer 120 on the first light-emitting part 110, and the process S3 of forming the second light-emitting part 130 that includes the second n-type semiconductor layer 131, the second active layer 132, and the second p-type semiconductor layer 133 in this order upward from below on the intermediate layer 120.

The first active layer 113 includes the multiple first well layers 115 that are arranged in the vertical direction, and the first barrier layer 116b that is positioned between two adjacent first well layers 115 among the multiple first well layers 115.

The second active layer 132 includes the multiple second well layers 134 that are arranged in the vertical direction, and the second barrier layer 135b that is positioned between two adjacent second well layers 134 among the multiple second well layers 134.

In the process S1 of forming the first light-emitting part 110, the first barrier layer 116b is formed at the first temperature T1. In the process S2 of forming the second light-emitting part 130, the second barrier layer 135b is formed at the second temperature T2 that is greater than the first temperature T1.

Thus, by setting the second temperature T2 to be greater than the first temperature T1, the surface state of the second barrier layer 135b can be better than when the second barrier layer is formed at the first temperature T1 used when forming the first barrier layer 116b. The crystallinity of the second well layer 134 formed on the second barrier layer 135b can be improved thereby. As a result, the luminous efficiency of the light-emitting element 10 can be increased.

The second active layer 132 further includes the third barrier layer 135c above the highest of the second well layers 134. The third barrier layer 135c is formed at the third temperature T3 that is less than the second temperature T2. Thereby, the thermal load on the first and second active layers 113 and 132 can be less than when the third barrier layer 135c is formed at the second temperature T2. As a result, the luminous efficiency of the light-emitting element 10 can be increased.

The difference between the third temperature T3 and the first temperature T1 is not more than 10° C. Thus, by reducing the difference between the third temperature T3 and the first temperature T1, the thermal load on the first and second active layers 113 and 132 can be reduced even further.

The second active layer 132 further includes the fourth barrier layer 135a below the lowest of the second well layers 134. The fourth barrier layer 135a is formed at the fourth temperature T4 that is less than the second temperature T2. Thereby, the thermal load on the fourth barrier layer 135a can be less than when the fourth barrier layer 135a is formed at the second temperature T2. As a result, the luminous efficiency of the light-emitting element 10 can be increased.

The difference between the fourth temperature T4 and the first temperature T1 is not more than 10° C. Thus, by reducing the difference between the fourth temperature T4 and the first temperature T1, the thermal load on the fourth barrier layer 135a can be reduced even further.

The temperatures when forming the first well layer 115 and the second well layer 134 are less than the second temperature T2. Therefore, the thermal load on the first and second well layers 115 and 134 can be reduced.

Also, the difference between the temperature when forming the second well layer 134 and the temperature when forming the first well layer 115 is not more than 10° C. Thus, by reducing the difference between the temperature when forming the second well layer 134 and the temperature when forming the first well layer 115, the thermal load on the first and second well layers 115 and 134 can be reduced even further.

The second barrier layer 135b and the second well layer 134 each are formed by supplying a raw material gas that includes a Group III element and a raw material gas that includes a Group V element. The value of the V/III ratio when forming the second barrier layer 135b is less than the value of the V/III ratio when forming the second well layer 134. Thereby, the second barrier layer 135b can be grown to easily fill the pits formed in the surface of the semiconductor layer on which the second barrier layer 135b is formed. As a result, the surface state of the second barrier layer 135b on which the second well layer 134 is formed can be improved, and the second well layer 134 can be formed to have good crystallinity.

The second barrier layer 135b includes the first portion p1, and the second portion p2 that is formed on the first portion p1. In the process S3 of forming the second light-emitting part 130, the second portion p2 is formed at a temperature that is greater than the first temperature T1 and greater than the temperature when forming the first portion p1. Thereby, the crystallinity of the second portion p2 that becomes the foundation of the second well layer 134 to be formed next can be improved while reducing the thermal load on the second well layer 134 located directly under the second barrier layer 135b.

The thickness of the second portion p2 is greater than the thickness of the first portion p1. Thereby, the crystallinity of the second barrier layer 135b can be improved even further.

The first barrier layer 116b and the second barrier layer 135b each include gallium nitride. The first well layer 115 and the second well layer 134 each include indium gallium nitride. Because the second barrier layer 135b includes the first portion p1 and the second portion p2, the crystallinity of the second well layer 134 can be improved by the second portion p2 while the first portion p1 reduces the thermal decomposition of the In included in the second well layer 134.

The intermediate layer 120 includes the third n-type semiconductor layer 121 that has a higher n-type impurity concentration than the second n-type semiconductor layer 131. Although the crystallinity of such an intermediate layer 120 easily degrades, the second temperature T2 is greater than the first temperature T1 according to the embodiment; therefore, the crystallinity of the second well layer 134 formed on the second barrier layer 135b can be improved. Therefore, the luminous efficiency of the light-emitting element 10 can be increased.

Examples

Examples and Reference Examples Will Now be Described

Light-emitting elements according to examples 1 and 2 and light-emitting elements according to reference examples 1 to 3 were made. The light-emitting elements according to the examples 1 and 2 and the light-emitting elements according to the reference examples 1 to 3 each had a layer structure similar to the light-emitting element 10 shown in FIG. 1. The light-emitting elements according to the examples 1 and 2 and the light-emitting elements according to the reference examples 1 to 3 were made by forming the first barrier layer and the second barrier layer using the temperature conditions shown in the following table, and by using common formation methods for the other layers. In the following table, the first and second temperatures T1 and T2 of the reference example 1 are taken as a reference temperature "Tref."

TABLE 1

|  | First temperature T1 | Second temperature T2 |
| --- | --- | --- |
| Reference example 1 | Tref | Tref |
| Reference example 2 | Tref + 50° C. | Tref |
| Reference example 3 | Tref + 100° C. | Tref |
| Example 1 | Tref | Tref + 50° C. |
| Example 2 | Tref | Tref + 100° C. |

The method for manufacturing the light-emitting elements according to the examples 1 and 2 and the light-emitting elements according to the reference examples 1 to 3 will now be elaborated.

A substrate made of sapphire was used as the substrate. First, a foundation layer that included an undoped GaN layer and had a thickness of about 5 μm was formed on the substrate.

Then, a first n-type semiconductor layer that had a thickness of about 5.5 μm and included an undoped GaN layer and a GaN layer doped with Si was formed on the foundation layer.

Continuing, a first active layer that included a sixth barrier layer, seven first well layers, six first barrier layers, and a fifth barrier layer was formed on the first n-type semiconductor layer. The sixth barrier layer included an undoped GaN layer, and an InGaN layer that was doped with Si. The thickness of the sixth barrier layer was about 5.1 nm. Each first well layer was an undoped InGaN layer. The thickness of each first well layer was about 2.5 nm. Each first barrier layer was an undoped GaN layer. The thickness of each first barrier layer was about 4.0 nm. The fifth barrier layer was an undoped GaN layer. The thickness of the fifth barrier layer was about 4.0 nm.

Then, a first p-type semiconductor layer that had a thickness of about 84 nm and included an AlGaN layer doped with Mg, an undoped GaN layer, and a GaN layer doped with Mg was formed on the first active layer.

Continuing, an intermediate layer was formed on the first p-type semiconductor layer. The intermediate layer included a third n-type semiconductor layer, a fourth n-type semiconductor layer that had a lower n-type impurity concentration than the third n-type semiconductor layer, and a fifth n-type semiconductor layer that had a lower n-type impurity concentration than the fourth n-type semiconductor layer. The third n-type semiconductor layer, the fourth n-type semiconductor layer, and the fifth n-type semiconductor layer were GaN layers doped with Si. The thickness of the third n-type semiconductor layer was about 2.5 nm, the thickness of the fourth n-type semiconductor layer was about 27 nm, and the thickness of the fifth n-type semiconductor layer was about 40 nm.

Then, a second n-type semiconductor layer that had a thickness of about 60 nm and included an InGaN layer doped with Si and a GaN layer doped with Si was formed on the intermediate layer.

Continuing, a second active layer that included a fourth barrier layer, seven second well layers, six second barrier layers, and a third barrier layer was formed on the second n-type semiconductor layer. The fourth barrier layer included an undoped GaN layer, and an InGaN layer that was doped with Si. The thickness of the fourth barrier layer was about 5.1 nm. Each second well layer was an undoped InGaN layer. The thickness of each second well layer was about 2.5 nm. Each second barrier layer was an undoped GaN layer. The thickness of each second barrier layer was about 4.0 nm. The third barrier layer was an undoped GaN layer. The thickness of the third barrier layer was about 4.0 nm.

Then, a second p-type semiconductor layer that had a thickness of about 114 nm and included an AlGaN layer doped with Mg, an undoped GaN layer, and a GaN layer doped with Mg was formed on the second active layer.

Then, portions of the first n-type semiconductor layer, the first active layer, the first p-type semiconductor layer, the intermediate layer, the second n-type semiconductor layer, the second active layer, and the second p-type semiconductor layer were removed; an n-side electrode was formed on the exposed first n-type semiconductor layer; a p-side electrode was formed on the second p-type semiconductor layer.

In the reference example 1, the first active layer and the second active layer were made at a substantially constant temperature Tref. In other words, in the reference example 1, the first temperature T1 when forming each first barrier layer and the second temperature T2 when forming each second barrier layer were substantially equal.

In the reference example 2, the first temperature T1 was 50° C. greater than the first temperature T1 of the reference example 1. In the reference example 2, the second temperature T2 was substantially equal to the first and second temperatures T1 and T2 of the reference example 1. In other words, the first temperature T1 of the reference example 2 was 50° C. greater than the second temperature T2 of the reference example 2.

In the reference example 3, the first temperature T1 was 100° C. greater than the first temperature T1 of the reference example 1. In the reference example 3, the second temperature T2 was substantially equal to the first and second temperatures T1 and T2 of the reference example 1. In other words, the first temperature T1 of the reference example 3 was 100° C. greater than the second temperature T2 of the reference example 3.

In the example 1, the first temperature T1 was substantially equal to the first temperature T1 of the reference example 1. In the example 1, the second temperature T2 was 50° C. greater than the first temperature T1 of the reference example 1. In other words, the second temperature T2 of the example 2 was 50° C. greater than the first temperature T1 of the example 2.

In the example 2, the first temperature T1 was substantially equal to the first temperature T1 of the reference example 1. In the example 2, the second temperature T2 was 100° C. greater than the first temperature T1 of the reference example 1. In other words, the second temperature T2 of the example 2 was 100° C. greater than the first temperature T1 of the example 2.

In the reference examples 2 and 3 and the examples 1 and 2, similarly to the reference example 1, the third temperature T3 when forming the third barrier layer, the fourth temperature T4 when forming the fourth barrier layer, the fifth temperature T5 when forming the fifth barrier layer, the sixth temperature T6 when forming the sixth barrier layer, the temperature when forming the first well layer, and the temperature when forming the second well layer were substantially equal to the temperature Tref.

Figure 10A:
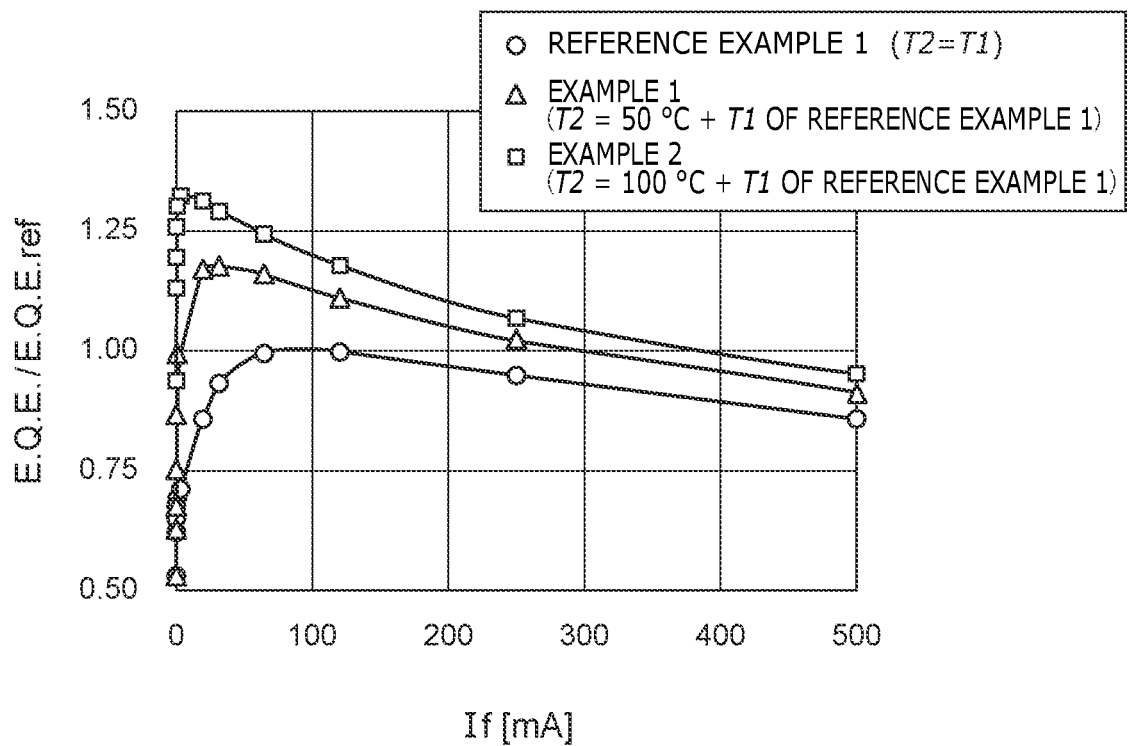
FIG. 10A is a graph showing relationships between forward currents If of light-emitting elements and values E.Q.E./E.Q.E.ref of normalized external quantum efficiency for examples 1 and 2 and a reference example 1.

FIG. 10A is a graph showing the relationship between a forward current If of the light-emitting element and a value E.Q.E./E.Q.E.ref of the normalized external quantum efficiency for the examples 1 and 2 and the reference example 1.

Figure 10B:
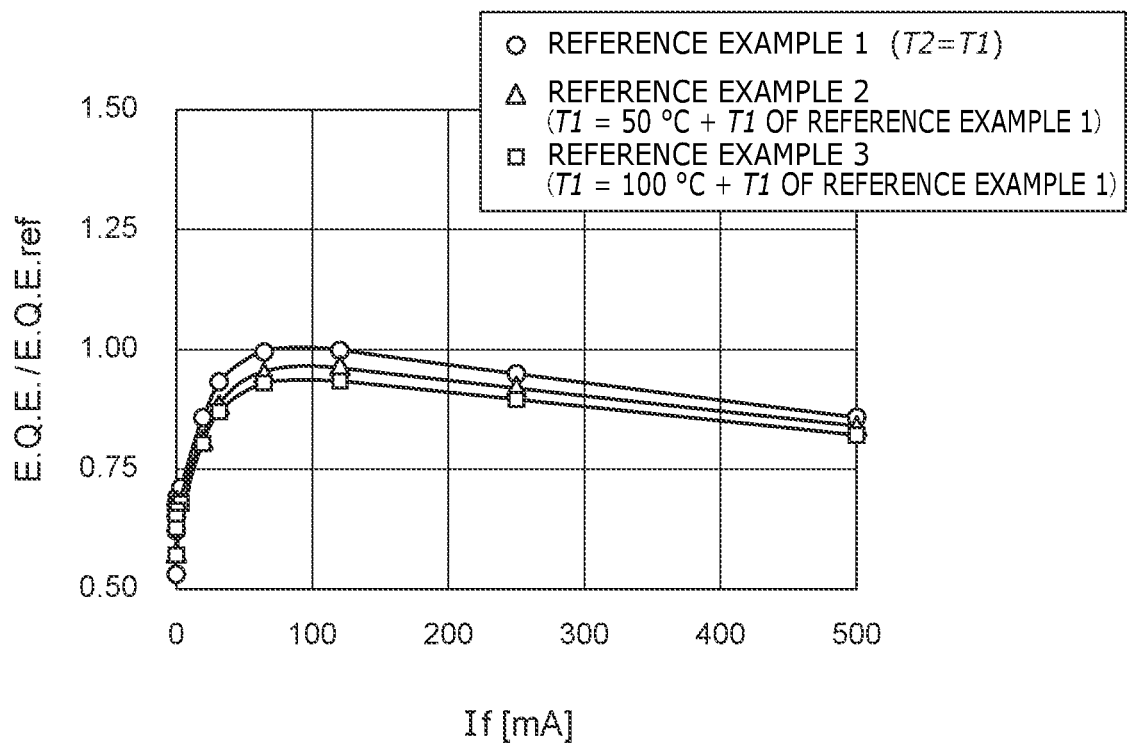
FIG. 10B is a graph showing relationships between forward currents If of light-emitting elements and values E.Q.E./E.Q.E.ref of normalized external quantum efficiency for the reference example 1 and references examples 2 and 3.

FIG. 10B is a graph showing the relationship between the forward current If of the light-emitting element and the value E.Q.E./E.Q.E.ref of the normalized external quantum efficiency for the reference examples 1 to 3.

The forward current If was changed from 0 mA to 500 mA for the light-emitting elements according to the examples 1 and 2 and the light-emitting elements according to the reference examples 1 to 3 that were made, and the external quantum efficiency E.Q.E. was measured. The results are shown in FIGS. 10A and 10B. In FIGS. 10A and 10B, the vertical axis is a normalized value in which the value of each external quantum efficiency E.Q.E. that was measured was divided by the maximum value E.Q.E.ref of the external quantum efficiency E.Q.E. of the reference example 1.

Also, the upper surface of the second active layer was imaged using an AFM (Atomic Force Microscope) for the light-emitting element according to the reference example 1 and the light-emitting element according to the example 2, and the average value of the diameters of the multiple pits was calculated. As a result, the average value of the pit diameter of the light-emitting element according to the reference example 1 was 158 nm, and the average value of the pit diameter of the light-emitting element according to the example 2 was 140 nm. In other words, the average value of the pit diameter of the light-emitting element according to the example 2 was about 11% less than the average value of the pit diameter of the light-emitting element according to the reference example 1.

As shown in FIG. 10B, it was found that, for the reference examples 2 and 3 in which the first temperature T1 was increased but the second temperature T2 was not increased with respect to the reference example 1, the external quantum efficiencies E.Q.E. of the light-emitting elements were less than the external quantum efficiency E.Q.E. of the light-emitting element according to the reference example 1. It is considered that this is because the increase of the temperature when forming the first barrier layer improved the crystallinity of the first barrier layer and reduced the pit diameter, but the thermal load on the first well layer was increased, and as a result and the luminous efficiency of the light-emitting element was not easily increased. Accordingly, it is considered that the effect of increasing the luminous efficiency as described herein is not easily obtained in a light-emitting element that includes one active layer.

On the other hand, as shown in FIG. 10A, it was found that the external quantum efficiencies E.Q.E. of the light-emitting elements according to the examples 1 and 2 in which the second temperature T2 was increased without increasing the first temperature T1 with respect to the reference example 1 were greater than the external quantum efficiency E.Q.E. of the light-emitting element according to the reference example 1. In a light-emitting element that includes two active layers, the second active layer is formed on the intermediate layer that has relatively degraded crystallinity. Therefore, the crystallinity of the second well layer included in the second active layer easily degrades, and the luminous efficiency of the light-emitting element decreases. Conversely, it is considered that by increasing the second temperature T2 when forming the second barrier layer as in the examples 1 and 2, the thermal load on the first and second well layers is increased, but the increase effect of the luminous efficiency due to the crystallinity improvement of the second barrier layer is large, and as a result, the luminous efficiency is increased.

As shown in FIG. 10A, it was found that the external quantum efficiencies of the light-emitting elements according to the examples 1 and 2 were improved with respect to the external quantum efficiency of the light-emitting element according to the reference example 1 particularly in the low current region.

Thus, it is favorable for the difference between the second temperature T2 and the first temperature T1 to be not less than 50° C. and not more than 100° C.

What is claimed is:

1. A method for manufacturing a light-emitting element, the method comprising:
   forming a first light-emitting part comprising a first n-type semiconductor layer, a first active layer on the first n-type semiconductor layer, and a first p-type semiconductor layer on the first active layer;
   forming an intermediate layer on the first light-emitting part; and
   forming a second light-emitting part on the intermediate layer, the second light-emitting part comprising a second n-type semiconductor layer, a second active layer on the second n-type semiconductor layer, and a second p-type semiconductor layer on the second active layer;
   wherein:
   the first active layer comprises a plurality of first well layers arranged in a vertical direction, and a first barrier layer positioned between two adjacent first well layers among the plurality of first well layers;
   the second active layer comprises a plurality of second well layers arranged in the vertical direction, and a second barrier layer positioned between two adjacent second well layers among the plurality of second well layers;
   the first barrier layer is formed at a first temperature;
   the second barrier layer is formed at a second temperature that is greater than the first temperature; and
   a difference between the second temperature and the first temperature is not less than 50° C. and not more than 100° C.

2. The method according to claim 1, wherein:
   the second active layer further comprises a third barrier layer above a highest of the second well layers; and
   the third barrier layer is formed at a third temperature that is less than the second temperature.

3. The method according to claim 2, wherein:
   a difference between the third temperature and the first temperature is not more than 10° C.

4. The method according to claim 1, wherein:
the second active layer further comprises a fourth barrier layer below a lowest of the second well layers; and
the fourth barrier layer is formed at a fourth temperature that is less than the second temperature.

5. The method according to claim 4, wherein:
a difference between the fourth temperature and the first temperature is not more than 10° C.

6. The method according to claim 1, wherein:
temperatures when forming the first and second well layers are less than the second temperature.

7. The method according to claim 2, wherein:
temperatures when forming the first and second well layers are less than the second temperature.

8. The method according to claim 6, wherein:
a difference between the temperature when forming the second well layer and the temperature when forming the first well layer is not more than 10° C.

9. The method according to claim 1, wherein:
the second barrier layer and the second well layer each are formed by supplying a raw material gas including a Group III element and a raw material gas including a Group V element; and
a value of a V/III ratio when forming the second barrier layer is less than a value of the V/III ratio when forming the second well layer, where the V/III ratio is a molar flow rate of the raw material gas including the Group V element divided by a molar flow rate of the raw material gas including the Group III element.

10. The method according to claim 1, wherein:
the second barrier layer comprises a first portion, and a second portion formed on the first portion; and
the second portion is formed at a temperature that is greater than the first temperature and greater than a temperature when forming the first portion.

11. The method according to claim 10, wherein:
a thickness of the second portion is greater than a thickness of the first portion.

12. The method according to claim 1, wherein:
the first barrier layer and the second barrier layer each comprise gallium nitride; and
the first well layer and the second well layer each comprise indium gallium nitride.

13. The method according to claim 1, wherein:
the intermediate layer comprises a third n-type semiconductor layer; and
an n-type impurity concentration of the third n-type semiconductor layer is higher than an n-type impurity concentration of the second n-type semiconductor layer.

14. A method for manufacturing a light-emitting element, the method comprising:
forming a first light-emitting part comprising a first n-type semiconductor layer, a first active layer on the first n-type semiconductor layer, and a first p-type semiconductor layer on the first active layer;
forming an intermediate layer on the first light-emitting part; and
forming a second light-emitting part on the intermediate layer, the second light-emitting part comprising a second n-type semiconductor layer, a second active layer on the second n-type semiconductor layer, and a second p-type semiconductor layer on the second active layer;
wherein:
the first active layer comprises a plurality of first well layers arranged in a vertical direction, and a first barrier layer positioned between two adjacent first well layers among the plurality of first well layers;
the second active layer comprises a plurality of second well layers arranged in the vertical direction, a second barrier layer positioned between two adjacent second well layers among the plurality of second well layers, and a third barrier layer above a highest of the second well layers;
the first barrier layer is formed at a first temperature;
the second barrier layer is formed at a second temperature that is greater than the first temperature; and
the third barrier layer is formed at a third temperature that is less than the second temperature.

15. The method according to claim 14, wherein:
a difference between the third temperature and the first temperature is not more than 10° C.

16. The method according to claim 14, wherein:
the second active layer further comprises a fourth barrier layer below a lowest of the second well layers; and
the fourth barrier layer is formed at a fourth temperature that is less than the second temperature.

17. The method according to claim 16, wherein:
a difference between the fourth temperature and the first temperature is not more than 10° C.

18. The method according to claim 14, wherein:
temperatures when forming the first and second well layers are less than the second temperature.

19. The method according to claim 14, wherein:
temperatures when forming the first and second well layers are less than the second temperature.

20. The method according to claim 19, wherein:
a difference between the temperature when forming the second well layer and the temperature when forming the first well layer is not more than 10° C.

21. A method for manufacturing a light-emitting element, the method comprising:
forming a first light-emitting part comprising a first n-type semiconductor layer, a first active layer on the first n-type semiconductor layer, and a first p-type semiconductor layer on the first active layer;
forming an intermediate layer on the first light-emitting part; and
forming a second light-emitting part on the intermediate layer, the second light-emitting part comprising a second n-type semiconductor layer, a second active layer on the second n-type semiconductor layer, and a second p-type semiconductor layer on the second active layer;
wherein:
the first active layer comprises a plurality of first well layers arranged in a vertical direction, and a first barrier layer positioned between two adjacent first well layers among the plurality of first well layers;
the second active layer comprises a plurality of second well layers arranged in the vertical direction, a second barrier layer positioned between two adjacent second well layers among the plurality of second well layers, and an additional barrier layer below a lowest of the second well layers;
the first barrier layer is formed at a first temperature;
the second barrier layer is formed at a second temperature that is greater than the first temperature;
the additional barrier layer is formed at a temperature that is less than the second temperature.

22. The method according to claim 21, wherein:
a difference between the temperature at which the additional barrier layer is formed and the first temperature is not more than 10° C.

* * * * *